United States Patent
Lin

(10) Patent No.: US 11,859,306 B2
(45) Date of Patent: Jan. 2, 2024

(54) MANUFACTURING METHOD OF SILICON CARBIDE INGOT

(71) Applicant: GlobalWafers Co., Ltd., Hsinchu (TW)

(72) Inventor: Ching-Shan Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 17/385,935

(22) Filed: Jul. 27, 2021

(65) Prior Publication Data

US 2022/0049372 A1 Feb. 17, 2022

Related U.S. Application Data

(60) Provisional application No. 63/056,730, filed on Jul. 27, 2020.

(51) Int. Cl.
*C30B 23/06* (2006.01)
*C23C 14/24* (2006.01)
*C23C 14/06* (2006.01)
*C30B 29/36* (2006.01)

(52) U.S. Cl.
CPC ........ *C30B 23/066* (2013.01); *C23C 14/0635* (2013.01); *C23C 14/24* (2013.01); *C30B 29/36* (2013.01)

(58) Field of Classification Search
CPC ... C30B 23/066; C30B 29/36; C23C 14/0635; C23C 14/24
See application file for complete search history.

(56) References Cited

U.S. PATENT DOCUMENTS

| 9,790,619 B2 | 10/2017 | Leonard et al. |
| 2005/0211156 A1* | 9/2005 | Gunjishima ............ C30B 23/00 117/2 |

(Continued)

FOREIGN PATENT DOCUMENTS

| CN | 101680112 | 3/2010 |
| CN | 104120489 | 4/2017 |

(Continued)

OTHER PUBLICATIONS

"Office Action of Taiwan Counterpart Application", dated Dec. 23, 2021, p. 1-p. 5.

(Continued)

*Primary Examiner* — Hua Qi
(74) *Attorney, Agent, or Firm* — JCIPRNET

(57) ABSTRACT

A manufacturing method of a silicon carbide ingot includes the following. A raw material containing carbon and silicon and a seed located above the raw material are provided in a reactor. A first surface of the seed faces the raw material. The reactor and the raw material are heated, where part of the raw material is vaporized and transferred to the first surface of the seed and a sidewall of the seed and forms a silicon carbide material on the seed, to form a growing body containing the seed and the silicon carbide material. The growing body grows along a radial direction of the seed, and the growing body grows along a direction perpendicular to the first surface of the seed. The reactor and the raw material are cooled to obtain a silicon carbide ingot. A diameter of the silicon carbide ingot is greater than a diameter of the seed.

8 Claims, 7 Drawing Sheets

(56) References Cited

U.S. PATENT DOCUMENTS

2007/0034145 A1* 2/2007 Maruyama .............. C30B 29/36
　　　　　　　　　　　　　　　　　　　　　117/92
2015/0255279 A1* 9/2015 Sasaki .................... C30B 23/06
　　　　　　　　　　　　　　　　　　　　　257/77
2016/0273129 A1* 9/2016 Sasaki .................... C30B 29/36

FOREIGN PATENT DOCUMENTS

| CN | 104246023 | | 2/2019 |
|---|---|---|---|
| JP | 2014210687 A | * | 11/2014 |

OTHER PUBLICATIONS

"Office Action of Taiwan Counterpart Application", dated Oct. 21, 2022, p. 1-p. 4.

* cited by examiner

US 11,859,306 B2

MANUFACTURING METHOD OF SILICON CARBIDE INGOT

CROSS-REFERENCE TO RELATED APPLICATION

This application claims the priority benefit of U.S. provisional application Ser. No. 63/056,730, filed on Jul. 27, 2020. The entirety of the above-mentioned patent application is hereby incorporated by reference herein and made a part of this specification.

BACKGROUND

Technical Field

The disclosure relates to a manufacturing method of a silicon carbide wafer. Particularly, the disclosure relates to a manufacturing method of a silicon carbide wafer by utilizing a seed.

Description of Related Art

At present, silicon wafers have been widely applied in the semiconductor industry.

Many electronic devices contain silicon chips made from silicon wafers. However, in order to improve the chip performance, many manufacturers are currently making attempts to employ silicon carbide wafers as materials for producing silicon carbide chips. The silicon carbide chip has high temperature resistance and high stability.

Generally speaking, during the process of manufacturing a silicon carbide wafer, a seed is first provided, and then a material is deposited on a surface of the seed, to form a silicon carbide ingot. After the silicon carbide ingot is formed, the silicon carbide ingot is cut into pieces to obtain a plurality of silicon carbide wafers. However, during manufacturing of the silicon ingot, the seed is of a high price, keeping up the manufacturing costs of the silicon carbide wafers.

SUMMARY

The disclosure provides a manufacturing method of a silicon carbide ingot. The diameter of the silicon carbide ingot formed by the manufacturing method is greater than the diameter of the seed in the process, thereby reducing the required costs of the seed.

At least one embodiment of the disclosure provides a manufacturing method of a silicon carbide ingot. The manufacturing method includes the following. A raw material containing carbon and silicon and a seed located above the raw material are provided in a reactor. A first surface of the seed faces the raw material. The reactor and the raw material are heated, where part of the raw material is vaporized and transferred to the first surface of the seed and a sidewall of the seed and forms a silicon carbide material on the seed, to form a growing body containing the seed and the silicon carbide material. The growing body grows along a radial direction of the seed, and the growing body grows along a direction perpendicular to the first surface of the seed. The reactor and the raw material are cooled to obtain the growing body that has completed growth. The growing body that has completed growth is a silicon carbide ingot. A diameter of the silicon carbide ingot is greater than a diameter of the seed.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A to FIG. 3A are schematic cross-sectional views of a manufacturing method of a silicon carbide ingot according to an embodiment of the disclosure.

FIG. 1B to FIG. 3B are schematic top views of the seed, the growing body, and the silicon carbide ingot of FIG. 1A to FIG. 3B.

DESCRIPTION OF THE EMBODIMENTS

FIG. 1A to FIG. 3A are schematic cross-sectional views of a manufacturing method of a silicon carbide ingot according to an embodiment of the disclosure. FIG. 1B to FIG. 3B are schematic top views of the seed, the growing body, and the silicon carbide ingot of FIG. 1A to FIG. 3B.

Figure 1A:
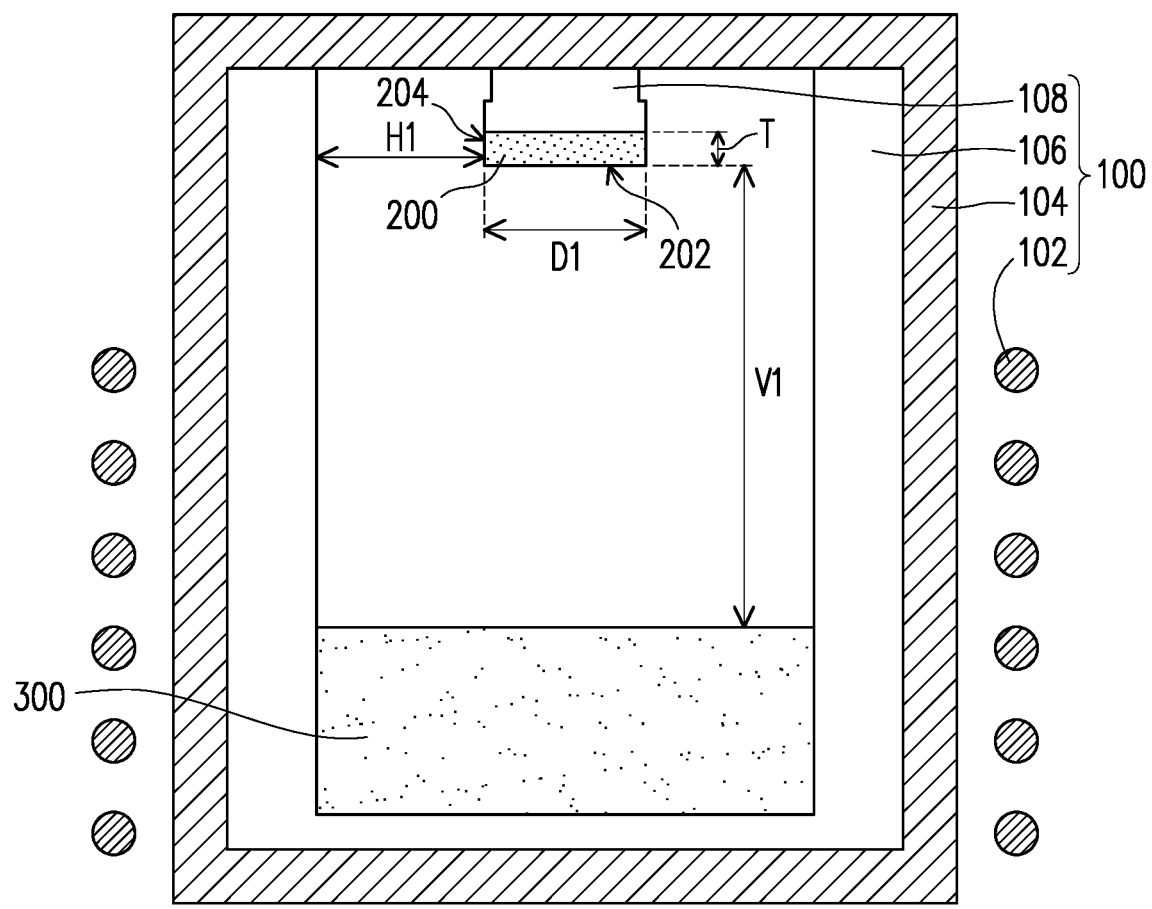
Figure 1B:
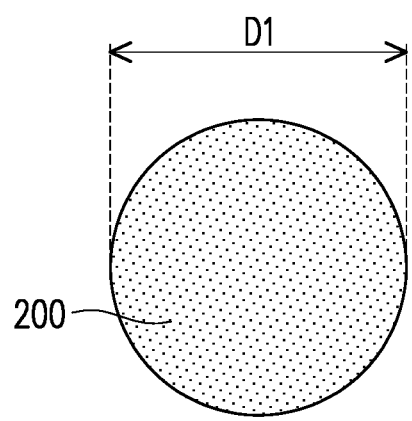

With reference to FIG. 1A and FIG. 1B, a reactor 100 includes an induction coil 102, a furnace body 104, a graphite crucible 106, and a seed support member 108. The graphite crucible 106 and the seed support member 108 are disposed in the furnace body 104. The induction coil 102 is disposed outside the graphite crucible 106.

A raw material 300 and a seed 200 located above the raw material 300 are provided in the reactor 100. The raw material 300 and the seed 200 are spaced apart by a vertical distance vi.

The raw material 300 is disposed in the graphite crucible 106. The raw material 300 contains carbon and silicon, and the raw material 300 is, for example, silicon carbide powder.

The seed 200 is disposed on the seed support member 108. In some embodiments, the seed 200 is fixed on the seed support member 108 by an adhesive layer (not shown). The material of the seed 200 includes silicon carbide. For example, the seed 200 is 6H-silicon carbide or 4H-silicon carbide. A first surface 202 of the seed 200 faces the raw material 300. A diameter of the seed 200 is D1. In some embodiments, the diameter D1 of the seed 200 is 25 mm to 250 mm.

In some embodiment, the first surface 202 of the seed 200 has a surface roughness (Ra) less than 2 nm, preferably a surface roughness (Ra) less than 0.5 nm, and more preferably a surface roughness (Ra) less than 0.3 nm. In some embodiments, the seed 200 has a total thickness variation (TTV) of less than 2 μm, a warp of less than 30 μm, and a bow of less than ±20 μm. In some embodiments, the first surface 202 of the seed 200 is the basal plane (0001) of silicon carbide.

In some embodiments, a thickness T of the seed 200 is greater than 0.2 mm, thereby increasing the area of a sidewall 204 of the seed 200. The sidewall 204 of the seed 200 is a ground smooth surface, thereby facilitates the growth of silicon carbide on the sidewall 204. In this embodiment, a lateral distance H1 between the side wall 204 of the seed 200 and the inner wall of the reactor 100 is 50 mm to 150 mm. Accordingly, space is sufficient for gas transmission between the side wall 204 of the seed 200 and the inner wall of the reactor 100, and the risk of contact of silicon carbide growing on the side wall 204 with the reactor 100 can be reduced.

Figure 2A:
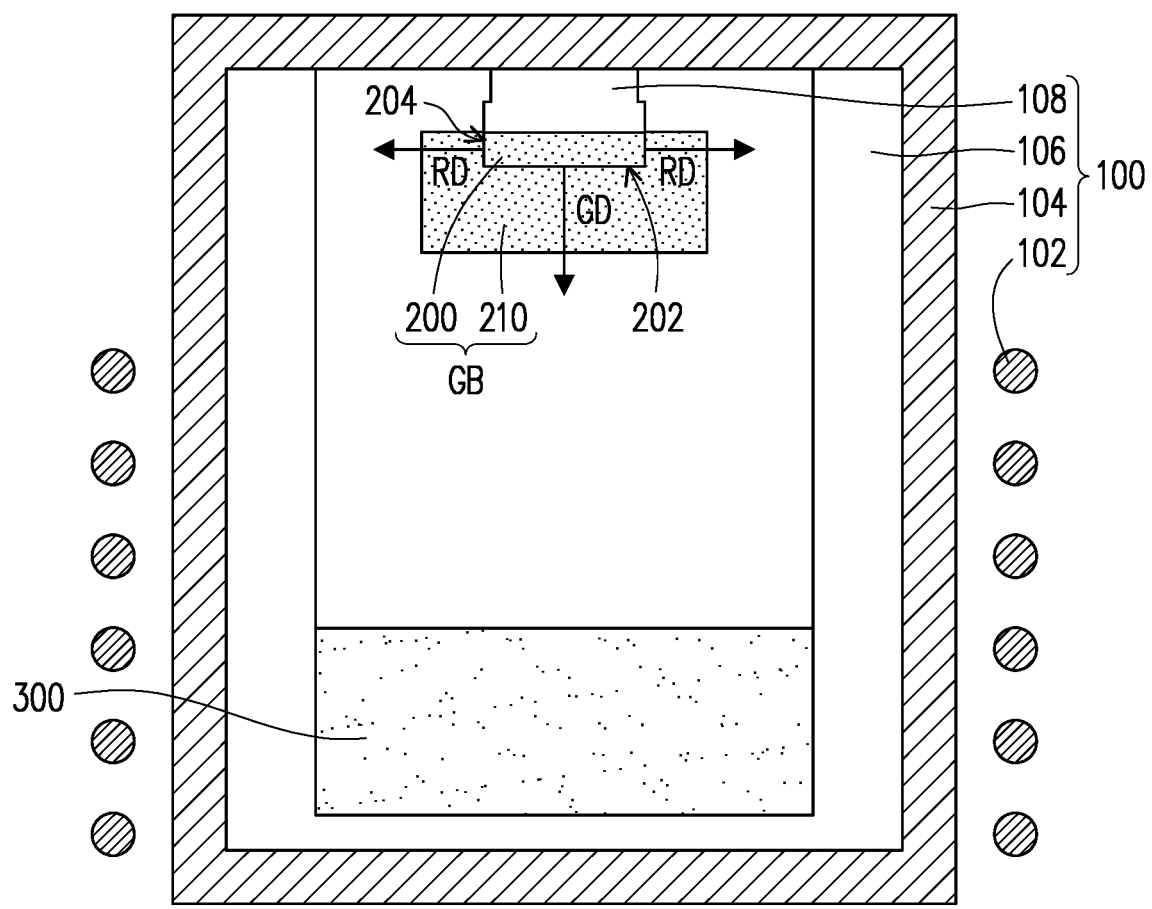
Figure 2B:
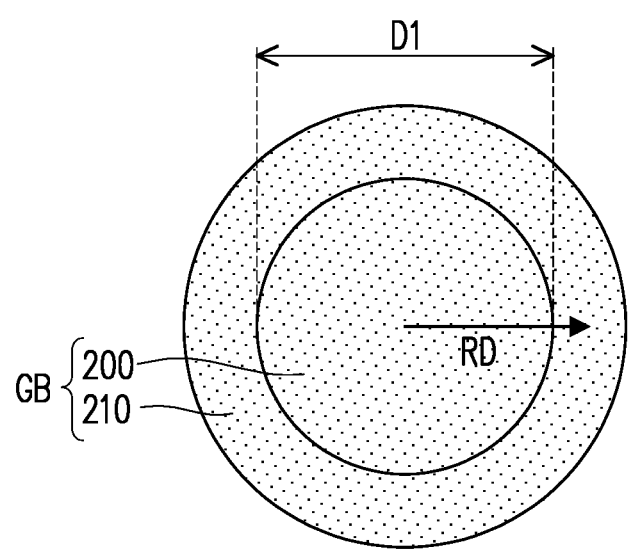

With reference to FIG. 2A and FIG. 2B, a silicon carbide material 210 is formed on the seed 200 by physical vapor transport (PVT). In this embodiment, the reactor 100 and the raw material 300 are heated by the induction coil 102 to form the silicon carbide material 210 on the first surface 202 of the seed 200 and on the sidewall 204 of the seed 200. The silicon carbide material 210 grows along a direction RD perpendicular to the sidewall 204 of the seed 200, and the silicon carbide material 210 grows along a direction GD perpendicular to the first surface 202 of the seed 200. The direction RD is the radial direction of the seed 200.

In this embodiment, when the raw material 300 at the bottom of the graphite crucible 106 is heated to a high temperature (higher than 1,900° C., for example) by the induction coil 102, the raw material 300 is sublimated, and under the drive of a temperature gradient, is transferred to the first surface 202 of the seed 200 and the sidewall 204 of the seed 200, and forms the silicon carbide material 210 on the seed 200, to form a growing body GB containing the seed 200 and the silicon carbide material 210. The growing body GB grows along the radial direction (the direction RD) of the seed 200, and the growing body GB grows along the direction GD perpendicular to the first surface 202 of the seed 200.

During the growing process of the growing body GB (or the silicon carbide material 210), the growing body GB (or the silicon carbide material 210) has a temperature gradient of 1° C./cm to 30° C./cm (which is to say, the entire thermal field in the radial direction RD has a temperature gradient of 1° C./cm to 30° C./cm) in the radial direction RD of the seed 200 (or the growing body GB), thus facilitating the growth of the growing body GB (or the silicon carbide material 210) along the direction RD.

In this embodiment, during the growing process of the growing body GB (or the silicon carbide material 210), the growing body GB (or the silicon carbide material 210) also has a temperature gradient in the direction GD, such that the growing body GB (or the silicon carbide material 210) accordingly grows along the direction GD.

In some embodiments, a growth rate of the growing body GB (or the silicon carbide material 210) in the direction RD is lower than a growth rate of the growing body GB (or the silicon carbide material 210) in the direction GD.

Figure 3A:
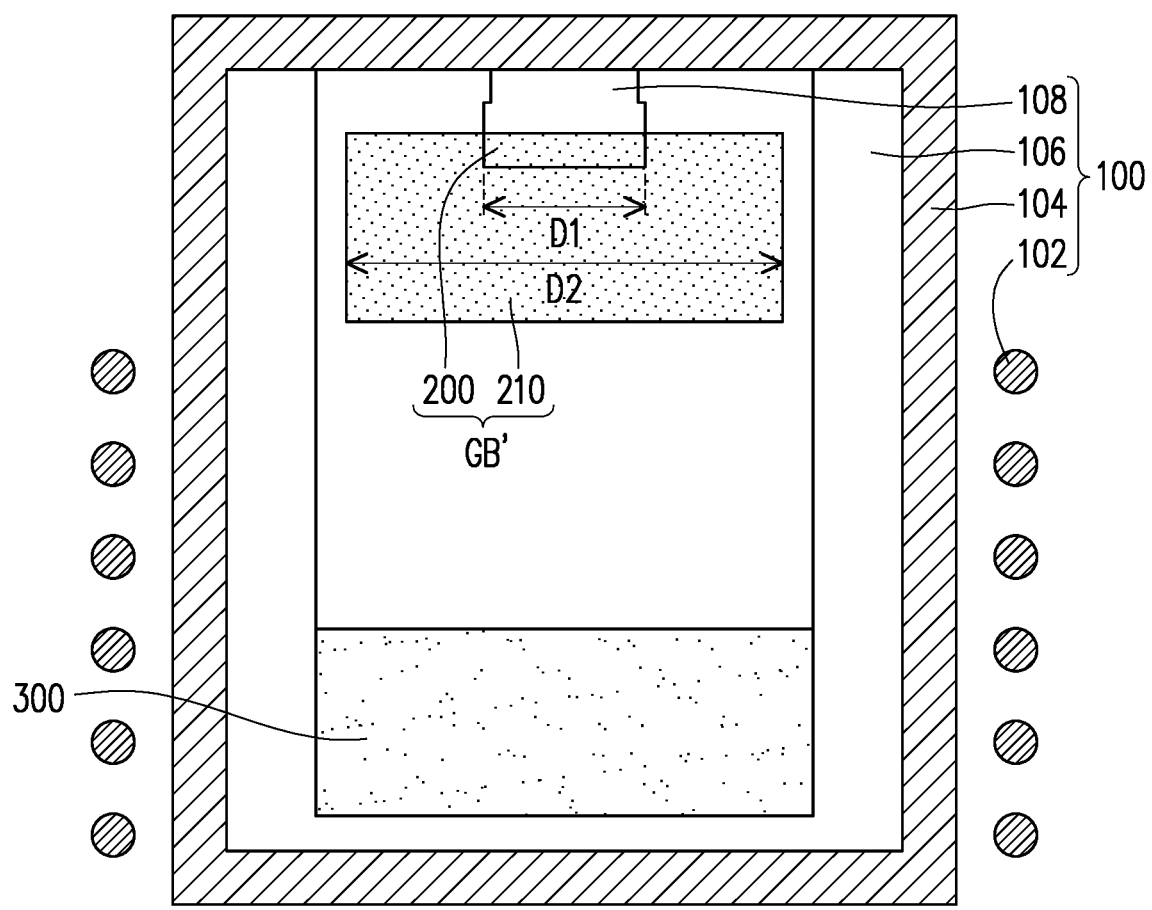
Figure 3B:
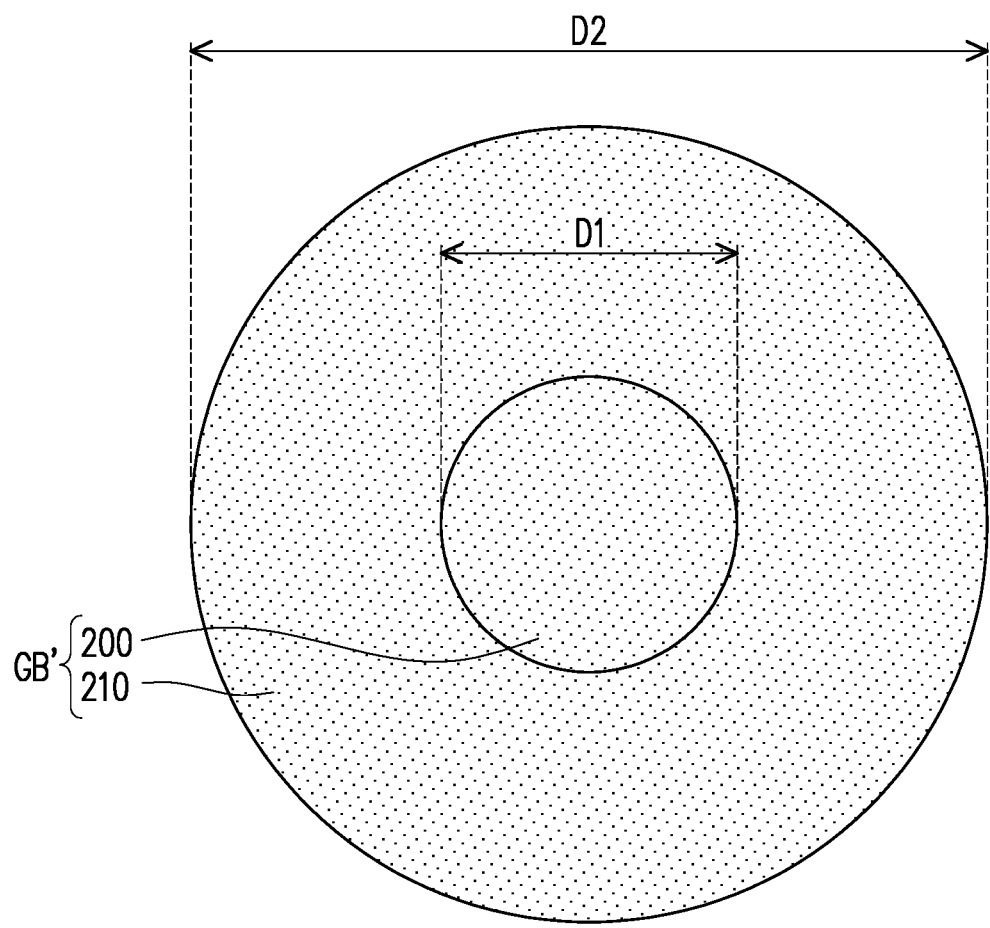

With reference to FIG. 3A and FIG. 3B, after the growing body GB grows to the required size, the reactor 100 and the raw material 300 are cooled to obtain the growing body that has completed growth. The growing body that has completed growth is a silicon carbide ingot GB', and the silicon carbide ingot GB' includes the silicon carbide material 210 that has completed growth and the seed 200.

A diameter D2 of the silicon carbide ingot GB' is greater than the diameter D1 of the seed 200. D1:D2 is 1:8 to 7.5:8. A through screw dislocation (TSD) of the silicon carbide ingot GB' obtained from the above process has a density of, for example, less than 100 pcs/cm².

Figure 4:
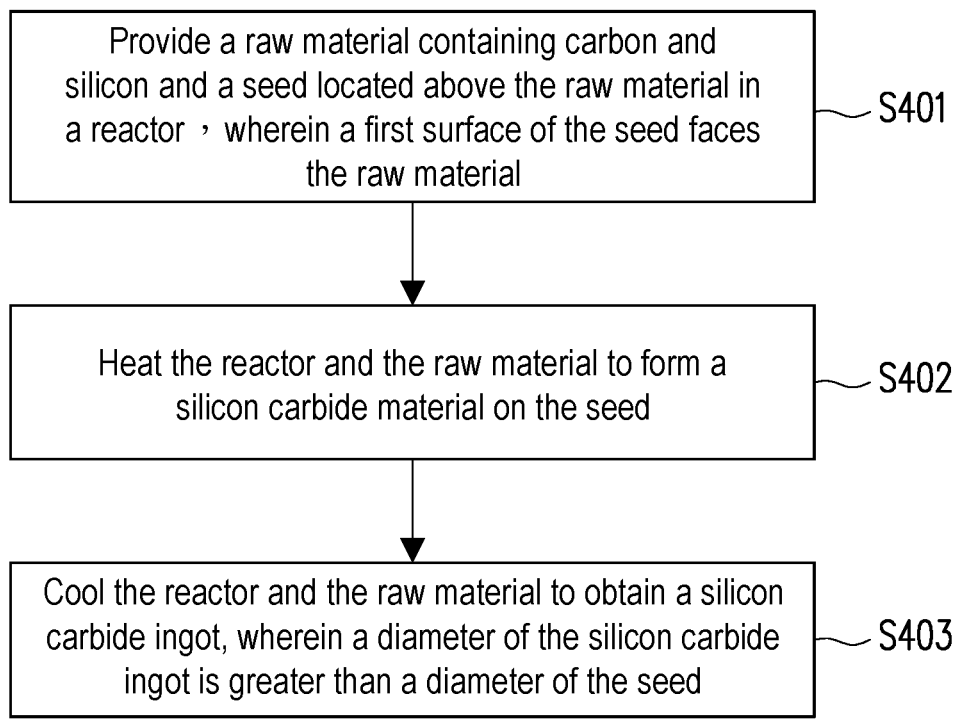
FIG. 4 is a flowchart of a manufacturing method of a silicon carbide ingot according to an embodiment of the disclosure.

FIG. 4 is a flowchart of a manufacturing method of a silicon carbide ingot according to an embodiment of the disclosure.

With reference to FIG. 4. In step S401, a raw material containing carbon and silicon and a seed located above the raw material are provided in a reactor, where a first surface of the seed faces the raw material.

In step S402, the reactor and the raw material are heated to form a silicon carbide material on the seed.

In step S403, the reactor and the raw material are cooled to obtain a silicon carbide ingot, and a diameter of the silicon carbide ingot is greater than a diameter of the seed.

Several experiments are provided as follows to verify the effects of the disclosure, but the content of the experiments are not intended to limit the scope of the disclosure.

Preparation Example 1

A silicon carbide ingot was manufactured by utilizing physical vapor transport.

During the growing process of the growing body (or the silicon carbide material), the growing body (or the silicon carbide material) had a temperature gradient of greater than 31° C./cm in the radial direction of the seed (or the growing body). Since the temperature gradient was overly great, the silicon carbide material was not likely to grow along the radial direction of the seed, such that a ratio of the diameter of the seed used to the diameter of the silicon carbide ingot obtained was about 1:1.

In this case, the silicon carbide ingot obtained did not exhibit good quality and many defects were present.

Preparation Example 2

A silicon carbide ingot was manufactured by utilizing physical vapor transport. For the manufacturing method, reference may be made to FIG. 1A to FIG. 3A and FIG. 1A to FIG. 3B.

During the growing process of the growing body (or the silicon carbide material), the growing body (or the silicon carbide material) had a temperature gradient of 6° C./cm to 30° C./cm (preferably 7° C./cm to 18° C./cm, and more preferably 7° C./cm to 10° C./cm) in the radial direction of the seed (or the growing body). Based on the temperature gradient, the silicon carbide material might grow along the radial direction of the seed, such that a ratio of the diameter of the seed used to the diameter of the silicon carbide ingot obtained was about 7.5:8.

In this case, the quality of the silicon carbide ingot obtained was better than the quality of the silicon carbide ingot obtained from <Preparation example 1>. In addition, the defect of the silicon carbide ingot obtained from <Preparation example 2> was about 30% less than the defect of the silicon carbide ingot obtained from <Preparation example 1>.

Preparation Example 3

A silicon carbide ingot was manufactured by utilizing physical vapor transport. For the manufacturing method, reference may be made to FIG. 1A to FIG. 3A and FIG. 1A to FIG. 3B.

During the growing process of the growing body (or the silicon carbide material), the growing body (or the silicon carbide material) had a temperature gradient of 5° C./cm to 18° C./cm (preferably 6° C./cm to 16° C./cm, and more preferably 6° C./cm to 7° C./cm) in the radial direction of the seed (or the growing body). Based on the temperature gradient, the silicon carbide material might grow along the radial direction of the seed, such that a ratio of the diameter of the seed used to the diameter of the silicon carbide ingot obtained was about 6:8.

In this case, the quality of the silicon carbide ingot obtained was better than the quality of the silicon carbide ingot obtained from <Preparation example 1>. In addition, the defect of the silicon carbide ingot obtained from <Preparation example 3> was about 40% less than the defect of the silicon carbide ingot obtained from <Preparation example 1>.

Preparation Example 4

A silicon carbide ingot was manufactured by utilizing physical vapor transport. For the manufacturing method, reference may be made to FIG. 1A to FIG. 3A and FIG. 1A to FIG. 3B.

During the growing process of the growing body (or the silicon carbide material), the growing body (or the silicon carbide material) had a temperature gradient of 3° C./cm to 16° C./cm (preferably 3° C./cm to 14° C./cm, and more preferably 5° C./cm to 6° C./cm) in the radial direction of the seed (or the growing body). Based on the temperature gradient, the silicon carbide material might grow along the radial direction of the seed, such that a ratio of the diameter of the seed used to the diameter of the silicon carbide ingot obtained was about 4:8.

In this case, the quality of the silicon carbide ingot obtained was better than the quality of the silicon carbide ingot obtained from <Preparation example 1>. In addition, the defect of the silicon carbide ingot obtained from <Preparation example 4> was about 50% less than the defect of the silicon carbide ingot obtained from <Preparation example 1>.

Preparation Example 5

A silicon carbide ingot was manufactured by utilizing physical vapor transport. For the manufacturing method, reference may be made to FIG. 1A to FIG. 3A and FIG. 1A to FIG. 3B.

During the growing process of the growing body (or the silicon carbide material), the growing body (or the silicon carbide material) had a temperature gradient of 3° C./cm to 14° C./cm (preferably 3° C./cm to 10° C./cm, and more preferably 4° C./cm to 5° C./cm) in the radial direction of the seed (or the growing body). Based on the temperature gradient, the silicon carbide material might grow along the radial direction of the seed, such that a ratio of the diameter of the seed used to the diameter of the silicon carbide ingot obtained was about 3:8.

In this case, the quality of the silicon carbide ingot obtained was better than the quality of the silicon carbide ingot obtained from <Preparation example 1>. In addition, the defect of the silicon carbide ingot obtained from <Preparation example 5> was about 60% less than the defect of the silicon carbide ingot obtained from <Preparation example 1>.

Preparation Example 6

A silicon carbide ingot was manufactured by utilizing physical vapor transport. For the manufacturing method, reference may be made to FIG. 1A to FIG. 3A and FIG. 1A to FIG. 3B.

During the growing process of the growing body (or the silicon carbide material), the growing body (or the silicon carbide material) had a temperature gradient of 3° C./cm to 12° C./cm (preferably 3° C./cm to 9° C./cm, and more preferably 3° C./cm to 4° C./cm) in the radial direction of the seed (or the growing body). Based on the temperature gradient, the silicon carbide material might grow along the radial direction of the seed, such that a ratio of the diameter of the seed used to the diameter of the silicon carbide ingot obtained was about 2:8.

In this case, the quality of the silicon carbide ingot obtained was better than the quality of the silicon carbide ingot obtained from <Preparation example 1>. In addition, the defect of the silicon carbide ingot obtained from <Preparation example 6> was about 70% less than the defect of the silicon carbide ingot obtained from <Preparation example 1>.

Preparation Example 7

A silicon carbide ingot was manufactured by utilizing physical vapor transport. For the manufacturing method, reference may be made to FIG. 1A to FIG. 3A and FIG. 1A to FIG. 3B.

During the growing process of the growing body (or the silicon carbide material), the growing body (or the silicon carbide material) had a temperature gradient of 1° C./cm to 10° C./cm (preferably 3° C./cm to 8° C./cm, and more preferably 2° C./cm to 3° C./cm) in the radial direction of the seed (or the growing body). Based on the temperature gradient, the silicon carbide material might grow along the radial direction of the seed, such that a ratio of the diameter of the seed used to the diameter of the silicon carbide ingot obtained was about 1:8.

In this case, the quality of the silicon carbide ingot obtained was better than the quality of the silicon carbide ingot obtained from <Preparation example 1>. In addition, the defect of the silicon carbide ingot obtained from <Preparation example 7> was about 80% less than the defect of the silicon carbide ingot obtained from <Preparation example 1>.

The results based on Preparation example 1 to Preparation example 7 are shown in Table 1 below. According to Table 1, during the growing process of the growing body (or the silicon carbide material), where the growing body (or the silicon carbide material) has a temperature gradient of less than 30° C./cm in the radial direction of the seed (or the growing body), it may be facilitate forming a silicon carbide ingot having a diameter greater than a diameter of the seed. Since the diameter of the silicon carbide ingot is greater than the diameter of the seed, a large-sized silicon carbide ingot may be obtained without using a large-sized seed, thereby reducing the manufacturing costs of the silicon carbide ingot.

TABLE 1

| Preparation example | Seed diameter: ingot diameter | Temperature gradient (°C./cm) of seed in radial direction | Result | Difference from defects of Preparation example 1 |
|---|---|---|---|---|
| 1 | 1:1 | greater than 31 | excessive defects | / |
| 2 | 7.5:8 | 6 to 30 | defects successfully reduced | 30% reduced |
| 3 | 6:8 | 5 to 18 | defects successfully reduced | 40% reduced |
| 4 | 4:8 | 3 to 16 | defects successfully reduced | 50% reduced |
| 5 | 3:8 | 3 to 14 | defects successfully reduced | 60% reduced |
| 6 | 2:8 | 3 to 12 | defects successfully reduced | 70% reduced |
| 7 | 1:8 | 1 to 10 | defects successfully reduced | 80% reduced |

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a silicon carbide ingot, comprising:

grinding a sidewall of a seed;

providing a raw material containing carbon and silicon and the seed located above the raw material in a reactor, wherein a first surface of the seed faces the raw material, wherein a lateral distance between the sidewall of the seed and an inner wall of the reactor is 50 mm to 150 mm;

heating the reactor and the raw material, wherein part of the raw material is vaporized and transferred to the first surface of the seed and the sidewall of the seed and forms a silicon carbide material on the seed, to form a growing body containing the seed and the silicon carbide material, wherein the growing body grows along a radial direction of the seed, and the growing body grows along a direction perpendicular to the first surface of the seed; and cooling the reactor and the raw material to obtain the growing body that has completed growth, wherein the growing body that has completed growth is the silicon carbide ingot, and a diameter of the silicon carbide ingot is greater than a diameter of the seed.

2. The manufacturing method as described in claim 1, wherein the diameter of the seed is D1, the diameter of the silicon carbide ingot is D2, and D1:D2 is 1:8 to 7.5:8.

3. The manufacturing method as described in claim 1, wherein during a growing process of the growing body, the growing body has a temperature gradient of 1° C/cm to 30° C/cm in a radial direction of the growing body.

4. The manufacturing method as described in claim 1, wherein during a growing process of the growing body, the growing body has a temperature gradient of 3° C/cm to 5° C/cm in a radial direction of the growing body.

5. The manufacturing method as described in claim 1, wherein a thickness of the seed is greater than 0.2 millimeter.

6. The manufacturing method as described in claim 1, wherein the diameter of the seed is 25 millimeters to 250 millimeters.

7. The manufacturing method as described in claim 1, wherein the first surface of the seed is a basal plane (0001) of silicon carbide.

8. The manufacturing method as described in claim 1, wherein a through screw dislocation of the silicon carbide ingot has a density of less than 100 pcs/cm$^2$.

* * * * *